United States Patent [19]

Stryjewski

[11] Patent Number: 5,424,736
[45] Date of Patent: Jun. 13, 1995

[54] LATCHED NEURAL NETWORK A/D CONVERTER

[75] Inventor: Wieslaw Stryjewski, Baton Rouge, La.

[73] Assignee: Louisiana Simchip Technologies, Inc., Baton Rouge, La.

[21] Appl. No.: 254,986

[22] Filed: Jun. 7, 1994

[51] Int. Cl.⁶ .............................................. H03M 1/12
[52] U.S. Cl. ...................................... 341/161; 341/155
[58] Field of Search ............... 341/161, 155, 156, 158, 341/159, 144

[56] References Cited

U.S. PATENT DOCUMENTS

| | | |
|---|---|---|
| 4,533,903 | 8/1985 | Yamada et al. . |
| 4,559,522 | 12/1985 | Sekino et al. . |
| 4,807,168 | 2/1989 | Moopenn et al. . |
| 4,983,974 | 1/1991 | Mijuskovic . |
| 4,987,417 | 1/1991 | Buckland .............. 341/159 |
| 4,994,806 | 2/1991 | Yun-Tae ................. 341/155 |
| 5,049,882 | 9/1991 | Gorecki et al. . |
| 5,068,662 | 11/1991 | Guddanti et al. . |
| 5,086,299 | 2/1992 | Frigerio et al. . |
| 5,179,631 | 1/1993 | Guddanti et al. . |
| 5,187,483 | 2/1993 | Yonemaru . |
| 5,194,867 | 3/1993 | Fisher . |
| 5,216,750 | 6/1993 | Smith . |
| 5,225,837 | 7/1993 | Hosotani et al. . |
| 5,258,760 | 11/1993 | Moody et al. . |
| 5,274,744 | 12/1993 | Yu et al. . |
| 5,274,745 | 12/1993 | Suzuoka . |
| 5,276,773 | 1/1994 | Knauer et al. . |

*Primary Examiner*—Brian K. Young
*Attorney, Agent, or Firm*—Hill, Steadman & Simpson

[57] ABSTRACT

An improved A/D converter is disclosed which employs variable voltage sources which provide reference levels for a plurality of voltage comparators. The outputs from the comparators feed forward into a latch. The higher-order outputs from the latch feed forward to the voltage sources for lower-order comparators. The reference levels of the lower-order comparators change based on the results from the higher-order outputs thus forming a neural network for performing the conversion. The latched outputs allow selection of a desired number of conversion steps or alternatively, the converter may be capable of determining when conversion is complete.

8 Claims, 3 Drawing Sheets

LATCHED NEURAL NETWORK A/D CONVERTER

BACKGROUND OF THE INVENTION

1. Field of the Invention

This invention relates generally to the field of analog-to-digital converters and more particularly this invention relates to neural network analog-to-digital converters with latched outputs for increased conversion speeds.

2. Description of the Prior Art

A wide variety of electronic circuit designs for analog to digital converters (referred to hereinafter as A/D converters) are known in the art. One particular design employs successive approximation to accomplish conversion. In this design a binary number generator is coupled to a digital-to-analog converter (referred to hereinafter as D/A converters). The output of the D/A converter is coupled to a first input of a comparator and the input analog voltage to be converted is coupled to a second input of the comparator. The output from the binary number generator changes in value until the output of the D/A converter approximately equals the input voltage. The binary number which the number generator is producing at the time this threshold is reached is considered the digital equivalent of the analog voltage. One drawback of this design is that a series of approximations must be performed which may consume a large number of clock cycles before an accurate result is achieved(n steps are required for an n-bit converter). Accordingly, this type of A/D converter is undesirably slow.

Another design which performs A/D conversions faster than successive approximation converters is a parallel flash A/D converter. In a parallel flash A/D converter, a binary digital output representative of the analog input voltage is produced in a single clock cycle. Conventional flash A/D converters employ resistor ladder networks in which a series of resistors each having similar values are connected between a reference voltage and ground to form nodes between the resistors that provide reference voltages for a plurality of comparators. The reference voltages are applied to a first input of each comparator and the analog input voltage to be converted is connected to a second input of each comparator. The output of the comparators depend on whether or not the input voltage exceeds the corresponding reference voltage. These outputs are encoded to produce a binary number having a value corresponding to the value of the analog input voltage. Although flash A/D converters are much faster than successive approximation designs, they require complex circuitry and increased power.

It is understood that in general there is a tradeoff between circuit size and speed in A/D converters. Conventional successive approximation A/D converters are relatively small in size, however, as noted they require a relatively large number of clock cycles to provide an accurate digital representation of the input analog voltage. In contrast, the flash A/D converter produces an output in essentially a single clock cycle, however, the circuitry for this design is much more complex. This design requires a resistor ladder network having $2^n+1$ resistors and $2^n$ comparators for an n-bit converter in addition to a decoding network. Thus, this design requires a relatively large array of solid state devices for implementation.

Another A/D converter design is found in U.S. Pat. No. 4,987,417 invented by Buckland. In this design, the outputs from higher order comparators feed forward through a resistor network to the reference inputs of lower order comparators. This forms a neural network for performing the conversion wherein the comparison voltage for a given comparator depends on the results from higher order comparators. The adaptive referencing ability of the circuit allows fewer elements to be used in implementation of the converter, however, valid conversion results are not available until each comparator produces a stable output.

While the prior art designs have improved the speed of A/D converters and/or decreased the circuitry necessary for implementation, there remains a need in the field for fast A/D converters with high resolution and limited circuit complexity. It is therefore an object of the present invention to provide a high resolution, high speed A/D converter which employs a limited number of circuit elements.

SUMMARY OF THE INVENTION

The latched neural network A/D converter of the present invention performs high-speed accurate conversions while minimizing the circuitry necessary for implementation. In this design, an analog input voltage is fed into a sample and hold unit to provide a fixed signal level output which is applied to the positive inputs of a plurality of voltage comparators. An R/2R resistor network provides reference voltages for the negative inputs of the comparators. The outputs from the comparators are applied to the inputs of a register which latches the comparator outputs. Higher-order outputs from the register feed forward through the R/2R resistor network and alter the reference voltages of the low-order comparators. This design forms a neural network for performing the conversion wherein the comparison voltages for the lower-order comparators depend on the output from higher-order comparators. Alternatively, the reference voltages for the comparators may be supplied by D/A converters which receive inputs from the outputs of higher-order comparators. These neural network designs operate in essentially the same manner and provide adaptive referencing which allows fewer elements to be used in circuit implementation.

It has been found that by latching the converter outputs, conversion speeds may be further increased without sacrificing a significant amount of conversion accuracy. Additional comparators may be used to determine if the current conversion results are the same as the results from previous clock-cycles. If the current results are the same as previous results, the conversion data is valid and the sample and hold unit may be cycled for converting another voltage value. Once identical results appear on the outputs from the register, it is known that the neural network is stable, the results are valid, and a new voltage may be converted. Alternatively, the output from the register may be used after a predetermined number of clock-cycles or conversion steps. Although occasionally this results in errors in the outputs for the low-order bits, it has been found that the error rate is small and statistically acceptable for many applications.

This A/D converter design of the invention provides fast, accurate conversion results with fewer components than designs of the prior art. Conversion results for full resolution are available at least within n clock cycles where n is the number of bits of resolution, however, valid data is often available much sooner than n clock cycles. The latched outputs of this design allow much greater flexibility in its use in that the converted output may be selected and used a predetermined number of clock cycles before the normal full n-step conversion process is complete.

DETAILED DESCRIPTION OF THE PREFERRED EMBODIMENTS

Figure 1:
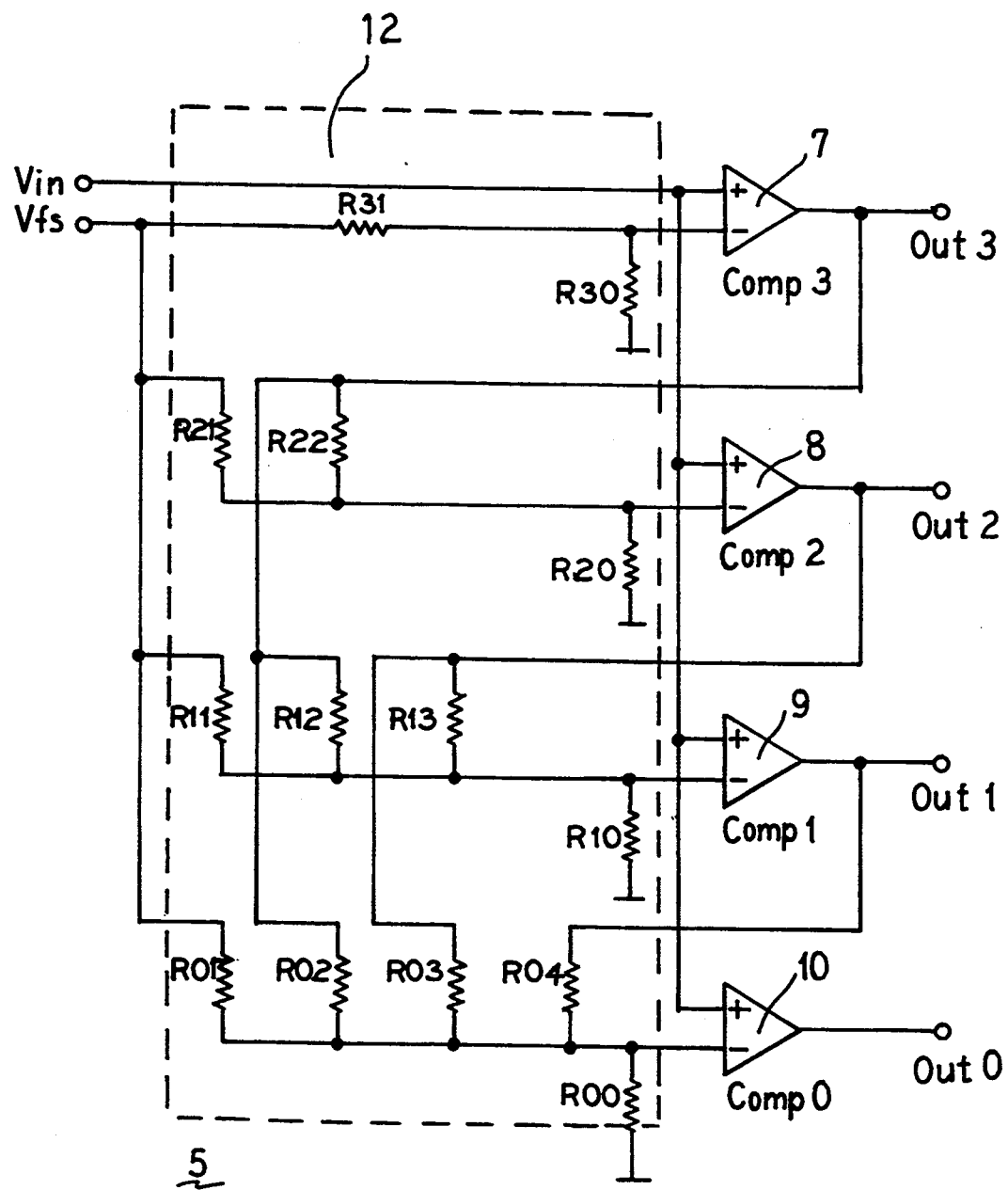
FIG. 1 illustrates an A/D converter of the prior art which employs a neural network for conversion.

FIG. 1 illustrates a prior art design of an A/D converter shown generally at 5. This design is described in more detail in U.S. Pat. No. 4,987,417 invented by Buckland. It employs a neural network for accomplishing conversion and requires only n converters to perform the conversion process wherein n is number of bits of resolution. This is in contrast to the $2^n$ comparators required for flash A/D converters.

An input voltage $V_{in}$ is input to a first input of each of the comparators 7–10. The output of all but the lowest-order comparator is fed forward to each of the remaining lower-order comparators through a resistor network 12. Reference voltage $V_{ref}$ is also supplied and connected through the resistor network to a second input of each of the comparators 7–10. Each of the comparators, other than the highest-order comparator, has a reference voltage which is a combination of $V_{ref}$ and the output of each of the higher-order comparators fed through the resistor network. This design decreases a circuit complexity in that for n-bits of resolution, only n comparators are needed rather than $2^n$ which are needed for a flash converter. However, this design sacrifices speed for circuit complexity in that valid conversion results are not available until each comparator produces a stable output.

Figure 2:
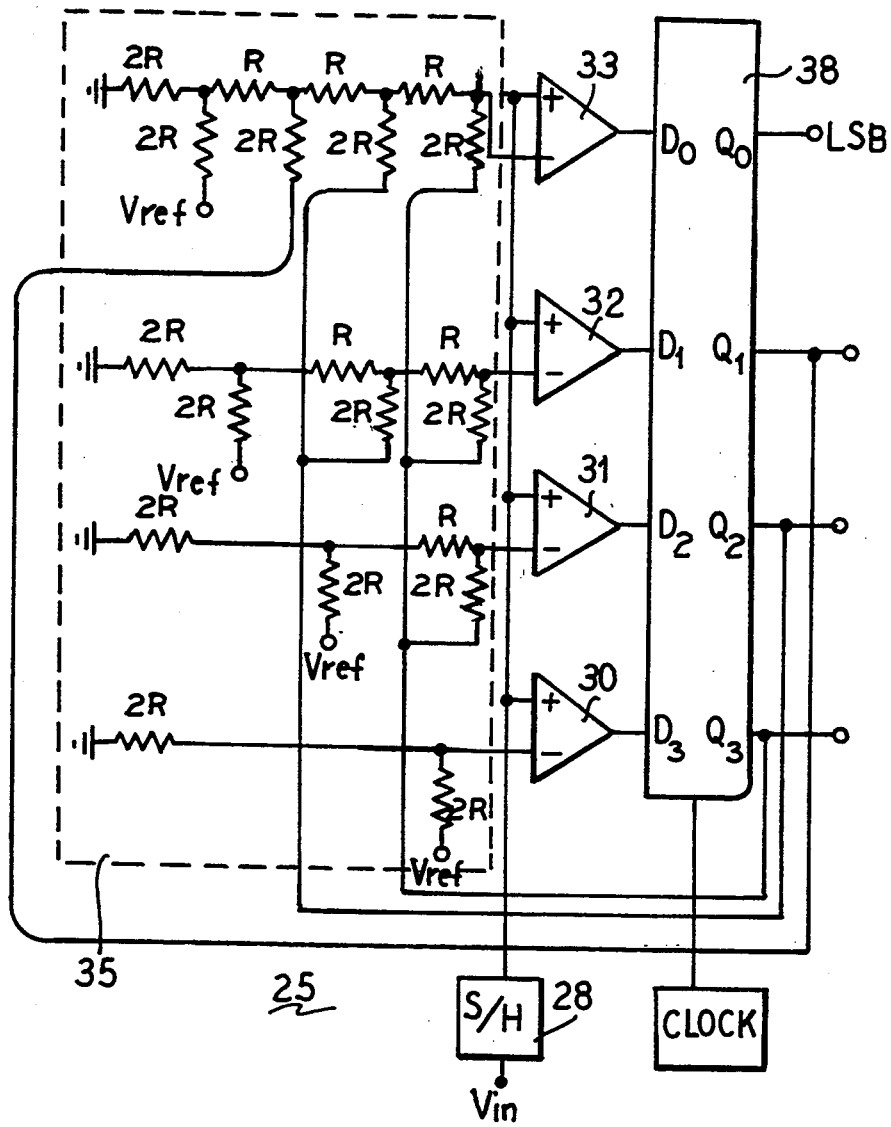
FIG. 2 illustrates an embodiment of the A/D converter of the present invention which provides 4-bits of resolution with a latched R/2R neural network A/D converter.

FIG. 2 illustrates an embodiment of the latched R/2R neural network A/D converter of the present invention. In this embodiment the R/2R latched neural network A/D converter 25 is shown as a converter with 4-bits of resolution. An analog input voltage $V_{in}$ is provided at the input of sample and hold unit 28. The output of sample and hold unit 28 is directly connected to each of the positive inputs of voltage comparators 30–33. There is one comparator for each bit of desired resolution. A reference voltage is applied to each of the negative inputs of comparators 30–33 via the R/2R resistor network 35. The outputs from the comparators 30–33 are applied to the inputs of a 4-bit register 38. Higher-order outputs from register 38 feed-forward through the R/2R resistor network and alter the reference voltages for the inputs of low-order comparators 31–33. The nodes in the R/2R resistor network which receive the outputs from the register are considered to be input control points. The voltage applied to these points help to determine the reference voltage of the comparators. This circuit forms a neural network for performing the conversion wherein the comparison voltages for lower-order comparators depend on the output from higher-order comparators. The latched converter outputs allow for increased conversion speeds without sacrificing a significant amount of accuracy.

Operation of this circuit will be explained by way of the following example. In this example it is assumed that Vref=16 V, and the analog input voltage Vin=6.5 V. Additionally, it is assumed that the outputs from the register 38 are 0 V initially. With the reference voltage set to 16 V, the threshold level of Comparator 30=8 V, the threshold of comparator 31=4 V, the threshold of comparator 32=2 V, and the threshold level of comparator 33=1 V.

The sample and hold unit 28 provides a stable output of the input analog voltage which, as noted is 6.5 V. The initial register output for the MSB remains at 0 v because (6.5<8 V), the register output which receives its input from comparator 31 changes to logical 1 because (6.5>4 V), the register output which receives its input from comparator 32 changes to logical 1 (because 6.5>2) and the register output which receives its input from comparator 33 changes to logical 1 (because 6.5>1).

The reference voltages for the comparators now change because the outputs from the register feed into the resistor network. The new levels are as follows: the threshold level of Comparator 30=8 V; the threshold of comparator 31=4 V; the threshold of comparator 32=6 V (4+2=6); and the threshold level of comparator 33=7 V (4+2+1). The register output for the MSB remains at 0 v because (6.5<8 V), the register output which receives its input from comparator 31 remains at logical 1 because (6.5>4 V), the register output which receives its input from comparator 32 remains logical 1 (because 6.5>6) and the register output which receives its input from comparator 33 changes to logical 0 (because 6.5<7).

This is the correct binary conversion value for the analog input voltage of 6.5 V. In this example it should be noted that the conversion was completed in but two steps. This result is significant in that it allows this converter design to operate at higher conversion speeds than would be expected. Details relating to the operation of this circuit with increased conversion speed is described below.

Figure 3:
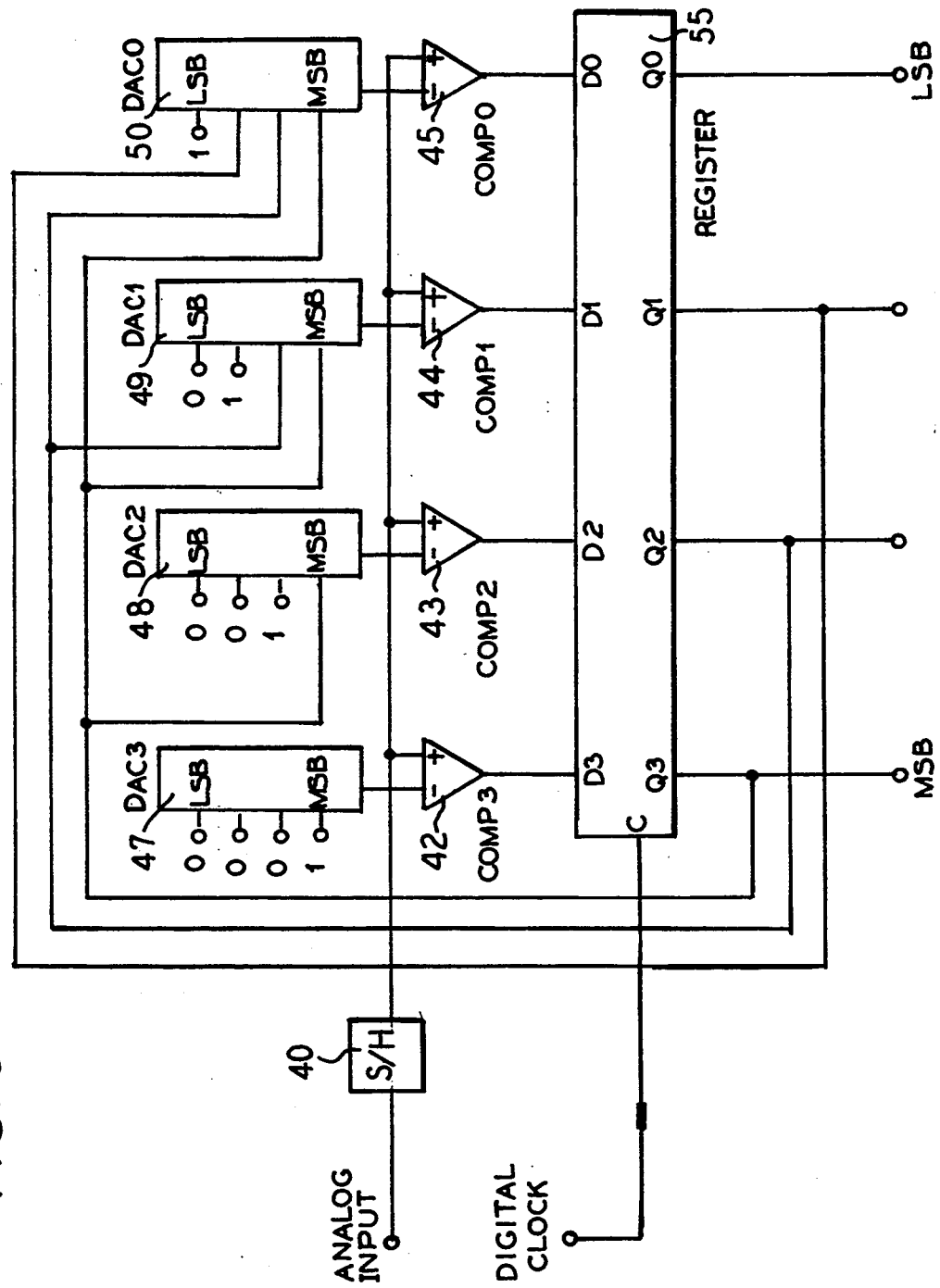
FIG. 3 illustrates an embodiment of the A/D converter of the present invention wherein D/A converters provide the reference voltages for the comparators.

FIG. 3 illustrates an alternate embodiment of the present invention wherein D/A converters supply the comparator reference voltages. In this design, an analog input voltage is applied to the input of a sample and hold unit 40 whose output feeds each of the positive inputs of voltage comparators 42–45. There is one comparator for each bit of desired resolution. D/A converters 47–50 supply the reference voltages to comparators 42–45 on the negative inputs. Outputs from the comparators 42–45 feed into the corresponding inputs of a 4-bit register 55. The outputs from all but the lowest-order comparator feed forward to D/A converters 48–50 which set the reference voltages of the remaining lower-order comparators. The inputs to the D/A converters are considered to be input control points. The voltage applied to these points help to determine the reference voltage of the comparators. The D/A converters thus provide adaptive voltage references for the comparators and form a neural network in which the reference voltages of the lower-order comparators are based on the outputs from higher-order comparators.

The output from the LSB+N comparator feeds forward to the LSB+N input of each of the lower-order D/A converters. The input bit of each D/A converter which corresponds to the latched-neural network converter output for which the D/A converter provides a voltage reference is set to logical "1", while the remaining low-order inputs of the D/A are fixed at logical "0" (i.e. the LSB input bit for the D/A converter which provides the reference voltage for the LSB comparator is set to logical "1" and none of the input bits on this D/A converter are set to logical "0"; the LSB+1 input bit for the converter which sets the reference voltage for the LSB+1 comparator is set to logical "1", while its LSB input is set to logical "0" etc.).

Operation of the circuit illustrated in FIG. 3 will be described with reference to the following example. In this example, D/A converters 47–50 are capable of supplying an output voltage of between 0 and 15 volts in 1 volt increments. It is assumed initially, that all digital outputs are logical "0". Thus, the initial threshold of comparator 42 is 8 V, the initial threshold of comparator 43 is 4 V, the initial threshold of comparator 44 is 2 volts and the initial threshold of comparator 45 is 1 V. The analog input voltage to be converted is 6.5 V. Sample and hold unit 40 provides a stable 6.5 V output which is applied to each of the positive inputs of comparators 42–45.

After the first clock cycle, the MSB output from the register 55 remains 0 (because 6.5<8); the output from the register corresponding to comparator 43 (MSB-1) changes to logical "1" (because 6.5>4); the output from the register corresponding to comparator 44 LSB+1) changes to logical "1" because (6.5>2); and the output from the register corresponding to the output from comparator 45 changes to logical "1" (because 6.5>1). The logical outputs from the comparators are stored in the register on the raising edge of each clock pulse.

The resulting changes are applied to the D/A converters 47–50. The threshold level of inputs to the comparators change based on changes at the inputs to the corresponding D/A converters. The threshold of comparator 42 remains unchanged at 8 V (this value does not depend on output from the register); the threshold of comparator 43 is now 4 V; the threshold of comparator 44 is 6 V; and the threshold level of comparator 45 is 7 V. The output from comparator 42 remains "0" (because 6.5<8); the output from comparator 43 remains "1" (because 6.5>4); the output from comparator 44 remains "1" (because 6.5>6); and the output from comparator 45 changes to logical "0" (because 6.5<7). The logical outputs from the comparators are stored in the register on the leading edge of the clock pulse. Conversion of this signal is now complete.

While conversion of an analog input voltage by the converter designs of the preferred embodiments will always be complete in n clock cycles where n is the number of bits of resolution, it has been found that valid outputs are often available much earlier. Conversion speeds can be dramatically increased without a corresponding decrease in conversion accuracy.

Figure 4:
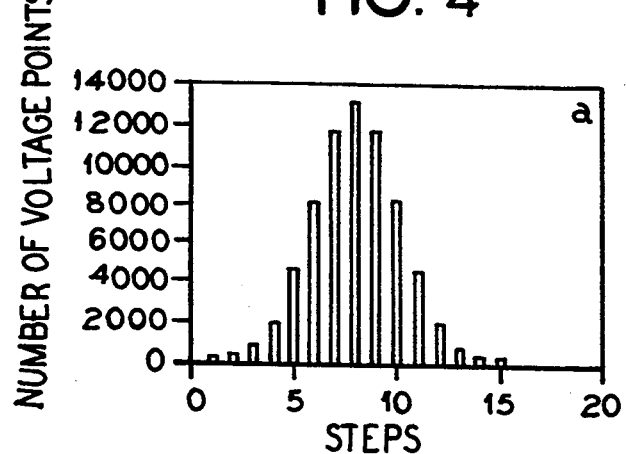
FIG. 4 illustrates the distribution of conversion steps required for converting $2^{16}$ voltage points with a 16-bit converter.

FIG. 4 illustrates the number of steps required to accurately convert a ramp of $2^{16}$ voltage points with a 16-bit converter of similar design to the embodiments described above. It is understood that the circuits described above can provide increased resolution simply by the addition of similar stages. FIG. 4 indicates that the number of steps required to perform accurate conversions using a 16-bit converter on the $2^{16}$ voltage points is a Gaussian-like distribution with 8 steps being the most frequent number of steps required to accurately perform the conversion.

It is recognized therefore that performing 16 conversion steps with the 16-bit converter is usually unnecessary. Accurate conversions can generally be completed in a few steps. It is recognized that an average of only n/2 steps are required to perform complete conversions where n is the number of bits of resolution of the converter. The recognition that fewer than n steps are usually required to convert a given voltage for an n-bit converter may be used to further increase conversion speeds. One technique for decreasing the number of steps is to compare the current outputs from registers with the outputs of the previous step. If the outputs remain unchanged, the conversion data is valid and the sample and hold unit may be cycled for converting another voltage value. When identical results appear on the output from the register, it is known that the neural network is stable, the results are valid, and a new voltage may be converted. This is due to the fact that if the outputs remain unchanged, the reference levels of all of the comparators will also remain unchanged. Any technique for comparing the outputs may be used including the use of voltage comparators.

Rather than comparing current results with previous results for determining when conversion is complete, the circuits of the present invention may be used to provide conversion results in a predetermined number of steps after conversion is initiated. Although it is likely that errors will occur in the lower-order output bits occasionally, it is believed that these occurrences are statistically insignificant and are acceptable for many applications.

In one final application, the two techniques could be combined whereby a microprocessor controls the conversion process to further increase the speed of conversion. It is recognized that the stability of the outputs from the register increase with an increasing number of conversion steps. Furthermore, the likelihood that a given register output is stable, decreases with decreasing significance of the particular output bit. The processor could be programmed to consider the output valid when either a given number of conversion steps have been performed or when only one or two lower-order bits have the potential for changing. These are but a few examples, a wide variety of alternatives exist for control of the A/D converters of the present invention via microprocessors.

The distribution of the number of steps required for complete conversion shown in FIG. 4 was based on the conversion of voltage values with all register outputs initially set to logical "0". Computer simulations indicate that even further savings in the number of steps will be realized if the results from previous conversions are used as a starting point for subsequent conversions. This is due to the fact that the converter essentially starts with the preceding conversion result for converting the next value. Simulated results indicate that in may instances only 2 steps are required to perform complete conversion.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

I claim:

1. A circuit for converting an analog voltage to a digital signal comprising:
   a plurality of voltage comparators including a highest-order comparator and a lowest-order comparator, each of said comparators having at least first and second inputs and an output;
   a corresponding voltage source for each of said comparators having an output connected to the first input of said voltage comparators and wherein the voltage sources other than the highest-order voltage source have at least one input control point;
   an analog input sampling unit having an output connected to the second input of each of said voltage comparators;
   a register having a plurality of inputs and outputs, each of said register inputs connected to an output of a corresponding comparator; and
   wherein each one of the outputs from the register defines an output for the circuit and at least one of a higher-order portion of the outputs from said register exclusively feeds forward to at least one of the input control points of a voltage source for a lower-order comparator to help determine a voltage reference level for the lower-order comparator.

2. The circuit of claim 1, wherein the voltage source is a digital-to-analog converter.

3. The circuit of claim 1, wherein the voltage source is a resistor ladder network.

4. A method for converting an analog voltage into a digital signal comprising the steps of:
   a) sampling an analog input voltage and providing a fixed voltage output;
   b) applying the fixed voltage output to a first input of a plurality of voltage comparators;
   c) applying a plurality of reference voltages from a plurality of voltage sources to a second input of the plurality of comparators;
   d) storing the outputs from the plurality of voltage comparators; and
   e) exclusively feeding forward the output from at least one of the voltage comparators to at least one of the plurality of voltage sources for adjusting the at least one voltage source when necessary.

5. The method for converting an analog voltage into digital signal of claim 4, wherein the voltage sources are D/A converters.

6. The method for converting an analog voltage into digital signal of claim 4, wherein the voltage sources are biased resistor ladders.

7. The method for converting an analog voltage into a digital signal of claim 4, further comprising the steps of:
   repeating steps c–e; and
   comparing the current outputs from the plurality of comparators with the previous outputs from the plurality of comparators.

8. The method for converting an analog voltage into a digital signal of claim 4, further comprising:
   repeating steps c–e a fixed number of times.

* * * * *